(12) United States Patent
Kamino

(10) Patent No.: US 9,460,242 B2
(45) Date of Patent: Oct. 4, 2016

(54) METHOD FOR SIMULATING RUN

(71) Applicant: DUNLOP SPORTS CO. LTD., Kobe-shi, Hyogo (JP)

(72) Inventor: Kazuya Kamino, Kobe (JP)

(73) Assignee: DUNLOP SPORTS CO. LTD., Kobe-Shi (JP)

( * ) Notice: Subject to any disclaimer, the term of this patent is extended or adjusted under 35 U.S.C. 154(b) by 303 days.

(21) Appl. No.: 13/778,286

(22) Filed: Feb. 27, 2013

(65) Prior Publication Data

US 2013/0226541 A1 Aug. 29, 2013

(30) Foreign Application Priority Data

Feb. 29, 2012 (JP) ................................ 2012-042987

(51) Int. Cl.
*G06F 17/50* (2006.01)
*A63B 69/40* (2006.01)

(52) U.S. Cl.
CPC ..... *G06F 17/5009* (2013.01); *A63B 2069/403* (2013.01); *A63B 2220/20* (2013.01)

(58) Field of Classification Search
None
See application file for complete search history.

(56) References Cited

U.S. PATENT DOCUMENTS

| | | | | |
|---|---|---|---|---|
| 4,160,942 A * | 7/1979 | Lynch | A63B 24/0021 | 359/443 |
| 5,221,082 A * | 6/1993 | Curshod | A63B 24/0021 | 434/252 |
| 5,478,077 A * | 12/1995 | Miyahara | | 473/154 |
| 5,586,940 A * | 12/1996 | Dosch et al. | | 473/140 |
| 7,255,649 B1 * | 8/2007 | McConnell | | 473/199 |
| 2002/0022531 A1 * | 2/2002 | Katayama | | 473/151 |
| 2002/0155896 A1 | 10/2002 | Gobush et al. | | |
| 2005/0215338 A1 * | 9/2005 | Miyamoto | | 473/155 |
| 2005/0227792 A1 * | 10/2005 | McCreary et al. | | 473/409 |
| 2005/0233815 A1 * | 10/2005 | McCreary et al. | | 473/131 |
| 2005/0233816 A1 * | 10/2005 | Nishino et al. | | 473/131 |
| 2006/0063574 A1 * | 3/2006 | Richardson et al. | | 463/1 |
| 2007/0010342 A1 * | 1/2007 | Sato et al. | | 473/151 |
| 2007/0075891 A1 | 4/2007 | Sajima | | |
| 2007/0105637 A1 * | 5/2007 | Shimizu | A63B 24/0003 | 473/151 |
| 2008/0182685 A1 * | 7/2008 | Marty et al. | | 473/407 |
| 2008/0200287 A1 * | 8/2008 | Marty et al. | | 473/459 |
| 2009/0088276 A1 * | 4/2009 | Solheim et al. | | 473/409 |
| 2010/0151956 A1 * | 6/2010 | Swartz et al. | | 473/199 |
| 2011/0040535 A1 * | 2/2011 | Sato | G06F 17/5018 | 703/2 |

(Continued)

FOREIGN PATENT DOCUMENTS

JP 2001-145718 A 5/2001
JP 2003-117044 A 4/2003

(Continued)

*Primary Examiner* — Kibrom K Gebresilassie
(74) *Attorney, Agent, or Firm* — Birch, Stewart, Kolasch & Birch, LLP

(57) ABSTRACT

This method simulates a run which is a distance between a landing point and a final arriving point using an initial condition of a hit ball and an actually measured falling condition. Preferably, the initial condition includes initial side spin. Preferably, the falling condition is a falling velocity. Preferably, a calculation formula of the run is a quadratic function having the initial condition and the falling condition as variables. Preferably, when the run is defined as Dr (yard); a target direction component of the falling velocity is defined as Vx (m/s); a vertical direction component of the falling velocity is defined as Vy (m/s); and the initial side spin is defined as S (rpm), the run is calculated according to the following formula: $Dr = C_1 \times Vx^2 - C_2 \times Vx + C_3 \times Vy^2 + C_4 \times Vy - C_5 \times S + C_6$.

1 Claim, 11 Drawing Sheets

(56) References Cited

U.S. PATENT DOCUMENTS

| | | | |
|---|---|---|---|
| 2011/0256944 A1* | 10/2011 | Sato | G06F 17/5018 473/165 |
| 2011/0257945 A1* | 10/2011 | Sato | G06F 17/5018 703/2 |
| 2011/0273562 A1* | 11/2011 | Dawe et al. | 348/139 |
| 2013/0213153 A1* | 8/2013 | Ishii et al. | 73/865.8 |
| 2014/0163915 A1* | 6/2014 | Baek et al. | 702/95 |

FOREIGN PATENT DOCUMENTS

| | | |
|---|---|---|
| JP | 2005-233800 A | 9/2005 |
| JP | 2007-301173 A | 11/2007 |
| JP | 2011-227869 A | 11/2011 |

* cited by examiner

METHOD FOR SIMULATING RUN

The present application claims priority on Patent Application No. 2012-042987 filed in JAPAN on Feb. 29, 2012, the entire contents of which are hereby incorporated by reference.

BACKGROUND OF THE INVENTION

1. Field of the Invention

The present invention relates to a method for simulating a run.

2. Description of the Related Art

In development of a golf club and a golf ball or the like, actual hitting is performed to investigate a flight distance and a direction of a hit ball, or the like. The hit ball lands after flying. Furthermore, the ball bounds and rolls to reach a final arriving point. A distance between a hitting point and a first landing point (hereinafter, merely referred to as a landing point) is referred to as a carry. A distance between the landing point and the final arriving point is referred to as a run. Particularly, a long flight distance is required in a driver shot. Data of the run is important. For example, a little run can be more important in a shot aiming at a green. The run is important data along with the carry.

A run is actually measured in Japanese Patent Application Laid-Open Nos. 2001-145718, 2005-233800, and 2007-101294 (US2007/0075891). In Japanese Patent Application Laid-Open No. 2002-306659 (US2002/0155896), a run is calculated based on an initial condition of a hit ball. Claim 19 of Japanese Patent Application Laid-Open No. 2003-117044 discloses a hit ball diagnosing system. The hit ball diagnosing system takes in a falling angle and a falling velocity component of a golf ball as an element for calculating a run to movement of the golf ball after the golf ball flies and lands, and multiplies a slowdown component changed for every bound by a slowdown component changed for every bound by a coefficient of restitution to a ground, for every bound, to control a distance of a run. However, the falling angle and the falling velocity component are estimated based on an initial condition.

SUMMARY OF THE INVENTION

The run is influenced by a situation of a landing area. Particularly, the situation of the landing point has a large influence on the run. Even when the velocities during falling are the same, the run fluctuates depending on the situation of the landing point. Fine irregularity exists even on a flatly leveled lawn surface. Grain of grass and a hardness are also slightly different depending on points. Therefore, in measurement of the run by actual measurement, variation occurs inevitably. The variation worsens the accuracy of the performance evaluation of the club or the ball. The fluctuation of the hardness of the landing area caused by the weather or the like also has an influence on the run. It is difficult to obtain data of a run having high reliability.

In estimation of the run from the initial condition, complicated calculation is required, and an error is apt to be caused.

It is an object of the present invention to obtain data of a run having high reliability.

The present invention is a method for simulating a run which is a distance between a landing point and a final arriving point using an initial condition of a hit ball and an actually measured falling condition.

Preferably, the initial condition includes initial side spin.

Preferably, the falling condition is a falling velocity. The falling velocity is a vector. A component Vx and a component Vy which will be described later are also included in the concept of the "falling velocity" in the present application.

Preferably, a calculation formula of the run is a quadratic function having the initial condition and the falling condition as variables.

Preferably, when the run is defined as Dr (yard); a target direction component of the falling velocity is defined as Vx (m/s); a vertical direction component of the falling velocity is defined as Vy (m/s); and the initial side spin is defined as S (rpm), the run is calculated according to the following formula (1):

$$Dr = C_1 \times Vx^2 - C_2 \times Vx + C_3 \times Vy^2 + C_4 \times Vy - C_5 \times S + C_6 \qquad (1)$$

wherein $C_1$, $C_2$, $C_3$, $C_4$, $C_5$, and $C_6$ are positive constants.

BRIEF DESCRIPTION OF THE DRAWINGS

FIG. 4 is a schematic view showing the disposal of the radar or the like;

DESCRIPTION OF THE PREFERRED EMBODIMENTS

Hereinafter, the present invention will be described in detail based on the preferred embodiments with appropriate references to the accompanying drawings.

Figure 1:
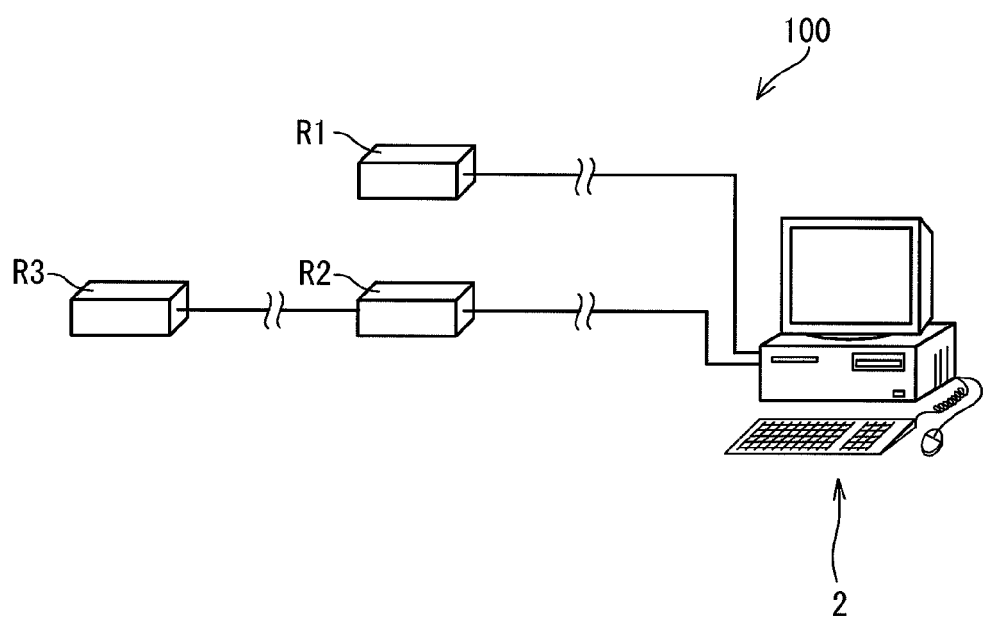
FIG. 1 is a schematic view showing a simulation apparatus according to an embodiment of the present invention.

As shown in FIG. 1, a simulation apparatus 100 has a computer 2 and a plurality of radars R1, R2, and R3. The plurality of radars R1, R2, and R3 is connected to the computer 2. The radar R1, the radar R2, and the radar R3 are the same. Although the number of the radars may be 1, in respect of measurement accuracy, the number of the radars is preferably equal to or greater than 2, and more preferably equal to or greater than 3. When a balance between the simplification of the apparatus and calculation, and the measurement accuracy is considered, the number of the radars is most preferably 3.

Hereinafter, the radar R1 will be described. However, the radar R2 and the radar R3 are also the same as the radar R1.

Figure 2:
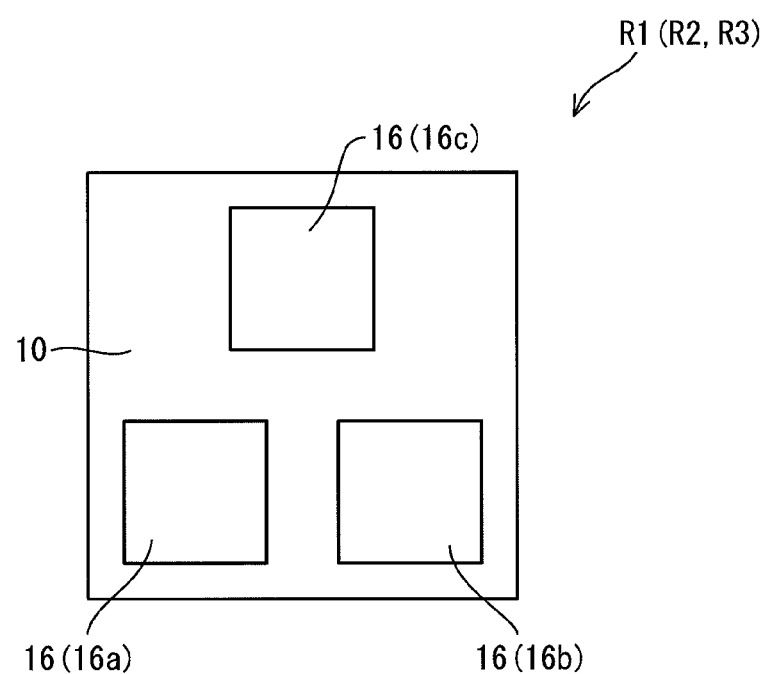
FIG. 2 is a plan view showing an example of a receiving part setting face of a radar.

FIG. 2 schematically shows a receiving part setting face 10 of the radar R1. The radar R1 has a transmitting part (not illustrated) and a plurality of receiving parts 16. In the embodiment, the radar R1 has three receiving parts 16a, 16b, and 16c. The transmitting part emits a radar wave to a flying ball. The receiving parts 16 receive the radar wave reflected from the ball. The first receiving part 16a, the second receiving part 16*b*, and the third receiving part 16*c* are at different positions. The radar R1 is set in a state where the receiving part setting face 10 is inclined to a vertical plane. The receiving part setting face 10 turns obliquely upward by the inclination. The inclination angle of the receiving part setting face 10 to the vertical plane can be set to approximately 10 degrees.

Although not illustrated in FIGS. 1 and 2, the simulation apparatus 100 includes an operating part for calculating a three-dimensional coordinate of the ball based on signals received by the receiving parts 16. The operating part is included in the radar R1. The operating part may be provided in the computer 2 connected to the radar R1, or the like.

The radar R1 can measure a velocity (three-dimensional velocity) of the ball using a Doppler effect. The radar R1 is a Doppler radar. A wavelength λ of the radar used in the embodiment is 28.57 mm; a frequency f thereof is 10.5 GHz; and output thereof is 10 mV. Even in a state of rain or fog, the radar can stably capture a target (ball). The radar enables measurement even when the circumference is dark.

Figure 3:
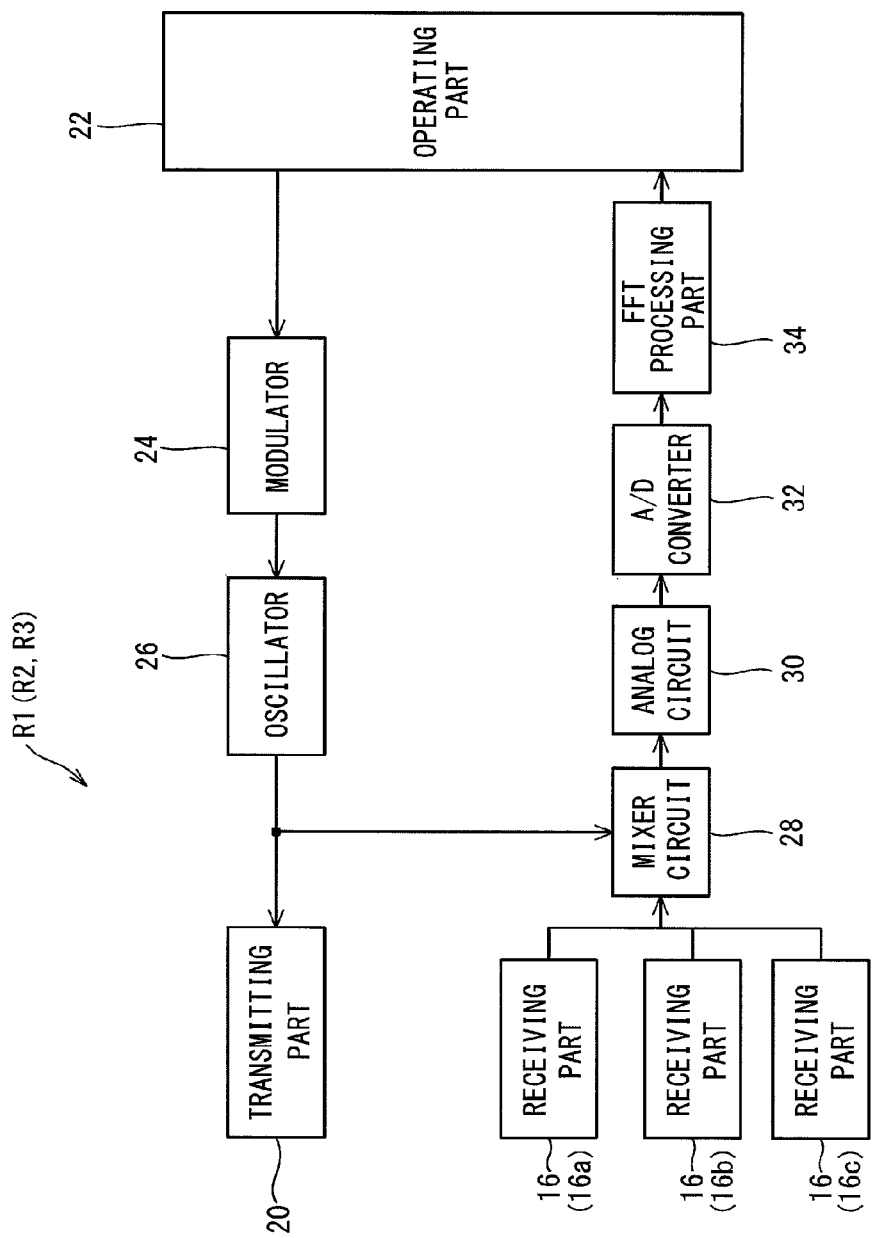
FIG. 3 is a functional block diagram of an example of the radar.

FIG. 3 is a system constitution view of the radar R1.

As described above, the receiving parts 16 receive an electric wave (radar wave) reflected from the ball. The velocity and three-dimensional coordinate of the ball are calculated based on the received signal (electric wave).

The three-dimensional coordinate of the ball is calculated based on three-dimensional information such as a three-dimensional direction and three-dimensional velocity of the ball. The three-dimensional coordinate of the ball is calculated by an operating part 22. The operating part 22 includes predetermined software, a CPU of a computer part for operating the software, and a memory, for example.

The operating part 22 calculates a three-dimensional velocity and a three-dimensional coordinate at each time of the ball based on information obtained from the reflective wave from the ball. A trajectory obtained based on the three-dimensional coordinate at each time may be displayed on a displaying part of a computer. The typical example of the displaying part is a monitor.

In order to obtain the three-dimensional information (the three-dimensional direction and the three-dimensional velocity or the like) of the ball, the number of the receiving parts (receivers) is preferably equal to or greater than 3. The three-dimensional information in regard to the ball is obtained based on a difference between the received electric waves (received signals) of the three receiving parts.

Examples of a method for obtaining the three-dimensional coordinate of the ball from the three-dimensional information of the ball include the following first and second methods. Both the first and second methods can be employed in the present invention. The three-dimensional coordinate of the ball may be obtained by the other method.

The first method obtains the three-dimensional direction of the ball as the three-dimensional information of the ball, and obtains a distance between the ball and the radar R1 to obtain the three-dimensional coordinate of the ball from the obtained three-dimensional direction and the obtained distance.

The second method obtains the three-dimensional velocity of the ball as the three-dimensional information of the ball, and sequentially integrates the obtained three-dimensional velocity to obtain the three-dimensional coordinate of the ball.

The three-dimensional coordinate of the ball may be obtained from the velocity of the ball and the three-dimensional direction of the ball.

In the radar R1, the three-dimensional velocity and three-dimensional coordinate of the ball are obtained by only one radar R1. The (three) receiving parts provided in the radar R1 enable one radar apparatus to acquire the three-dimensional information.

A distance between the radar R1 and the ball can be calculated based on a time period required from transmission to reception. The plurality of receiving parts receives the electric waves transmitted from the same transmitting part and having two kinds of frequencies, and thereby the distance between the radar R1 and the ball can be obtained. The velocity of the ball can be calculated based on a Doppler shift.

The radar R1 has a modulator 24 and an oscillator 26 in addition to the receiving parts 16, the transmitting part 20, and the operating part 22. A signal having a transmitting frequency based on a modulating signal from the modulator 24 and transmitted from the oscillator 26 is transmitted from the transmitting part 20. An electric wave signal reflected from the ball is received by the receiving parts 16.

The radar R1 has a mixer circuit 28, an analog circuit 30, an A/D converter 32, and an FFT processing part 34. The electric wave signal received by the receiving parts 16 is frequency-converted by the mixer circuit 28. In addition to the electric wave signal received by receiving parts 16, a signal from the oscillator 26 is supplied to the mixer circuit 28. The mixer circuit 28 mixes the signal from the receiving parts 16 with the signal from the oscillator 26. A signal generated by mixing is output to the analog circuit 30. A signal amplified by the analog circuit 30 is output to the A/D converter 32. A signal converted to a digital signal by the A/D converter 32 is supplied to the FFT processing part 34. The FFT processing part 34 performs fast Fourier transform (FFT). Information for an amplitude and phase is obtained from a frequency spectrum of the signal by the fast Fourier transform, and the information is supplied to the operating part 22. The operating part 22 calculates a distance to the ball and a velocity of the ball from the information from the FFT processing part 34.

The velocity of the ball (the relative velocity between the radar R1 and the ball) can be calculated by utilizing the Doppler shift. The distance to the ball (the distance between the radar R1 and the ball) can be calculated by utilizing a dual-frequency CW (Continuous Wave) system, for example.

In the case of the dual-frequency CW system, a modulating signal is input into the oscillator 26. The oscillator 26 supplies two frequencies f1 and f2 to the transmitting part 20 while temporally switching the frequencies f1 and f2. The transmitting part 20 transmits the two frequencies f1 and f2 while temporally switching the frequencies f1 and f2. An electric wave transmitted from the transmitting part 20 is reflected by the ball. A reflected signal is received by the three receiving parts 16. The mixer circuit 28 multiplies the received signal by the signal of the oscillator 26 to obtain a bead signal. In the case of a homodyne system, the beat signal output from the mixer circuit 28 has a Doppler frequency. The received signal in each transmitting frequency is separately demodulated by the analog circuit 30, and is A/D converted by the A/D converter 32. Digital sample data obtained by the A/D conversion is subjected to fast Fourier transform processing by the FFT processing part 34. A frequency spectrum in the entire frequency band of the received beat signal is obtained by the fast Fourier transform processing. A power spectrum of a peak signal having a transmitting frequency f1 and a power spectrum of a peak signal having a transmitting frequency f2 are obtained for a peak signal obtained as a result of the fast Fourier transform processing based on the principle of the dual-frequency CW system. The distance to the ball is calculated from a phase difference of the two power spectra.

The three-dimensional coordinate of the ball is uniquely determined by grasping the distance to the ball and the three-dimensional direction of the ball as described above.

The three-dimensional coordinate of the ball can also be calculated by sequentially integrating the three-dimensional velocity of the ball. In order to obtain the three-dimensional velocity of the ball, the principle of the Doppler shift is utilized. In order to obtain the three-dimensional velocity, three or more receiving parts 16 are provided. Preferably, all the receiving parts 16 are provided in the radar R1. The three or more receiving parts are respectively disposed at different positions. Since the receiving parts 16 are disposed at the different positions, relative velocities between the receiving parts 16 and the ball are different from each other. The three-dimensional velocity of the ball is calculated based on the relative velocities between the receiving parts 16 and the ball. The three-dimensional velocity is integrated by the operating part 22.

A one-dimensional coordinate of the ball may be calculated by sequentially integrating a one-dimensional velocity of the ball. A two-dimensional coordinate of the ball may be calculated by sequentially integrating a two-dimensional velocity of the ball. In this case, the three-dimensional coordinate of the ball can be obtained by combining the obtained one-dimensional coordinate or the obtained two-dimensional coordinate with the other data (the direction of the ball, or the like).

In the embodiment, an initial condition and falling condition of the ball are measured. Therefore, the need for the three-dimensional coordinate of the ball can be eliminated. However, a measurement position of the falling condition (falling velocity) can be accurately determined by grasping the coordinate of the ball (for example, a height above a ground).

Figure 4:
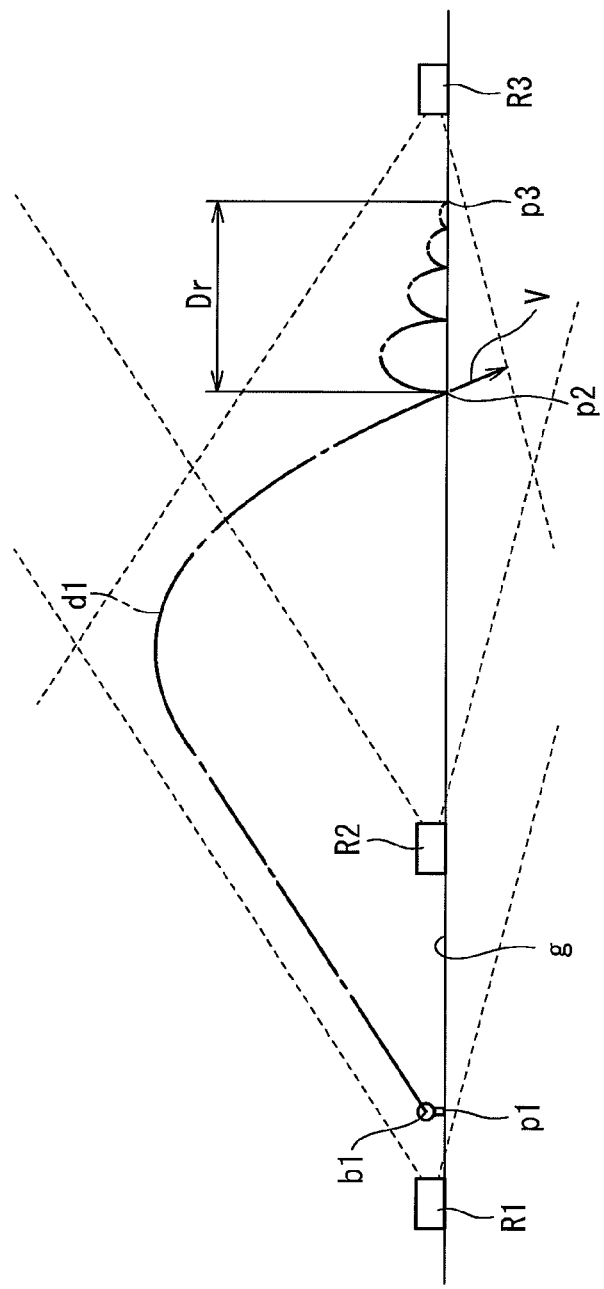

FIG. 4 describes a measuring method. A trajectory d1 is shown by a dashed-dotted line. A first radar R1 is disposed behind a hit ball position. A third radar R3 is disposed near a landing position. A second radar R2 is disposed between the radar R1 and the radar R3. The radar R2 measures the falling condition (falling velocity) from one side (ball hitting point side). The radar R3 measures the falling condition (falling velocity) from the other side. The measurement accuracy can be improved by the measurement from the two directions.

The radar R1 can accurately measure the initial condition and the initial stage of the trajectory d1. The radar R2 can accurately measure the intermediate stage to last half stage of the trajectory d1. The radar R3 can accurately measure the last half stage and falling condition of the trajectory d1.

Data having high intensities are used among the reflective wave data from the three radars R1, R2, and R3. The trajectory d1 can be determined by connecting these data by an approximated curve. The measurement accuracy of the trajectory d1 can be improved by the method. The falling condition can be accurately measured. In respect of the measurement accuracy, the falling condition is preferably measured using the data having high intensities among the reflective wave data from the three radars R1, R2, and R3.

An extent of a region capable of being measured by the radar depends on a beam width (also referred to as a beam angle). A moving object can be accurately measured in the beam width. The beam width is represented by a half-value width of electric power, for example. The half-value width is an angle width until the electric power transmitted from the transmitting part is reduced to half of the highest value observed on the front side of the radar. Preferably, the radar R1 is set so that the entire trajectory d1 is within the region of the beam width. Preferably, the radar R2 is set so that a landing point p2 is within the region of the beam width. Preferably, the radar R3 is set so that the landing point p2 is within the region of the beam width. More preferably, the radar R3 is set so that the entire trajectory d1 is within the region of the beam width.

In respect of the measurement accuracy of the falling condition, a distance between the radar R3 and the landing point p2 is preferably equal to or less than 100 yards, more preferably equal to or less than 70 yards, and still more preferably equal to or less than 50 yards. In respect of the measurement accuracy for the last half of the trajectory d1 and the falling condition, a distance between the radar R2 and the landing point p2 is preferably equal to or less than 170 yards, more preferably equal to or less than 160 yards, and still more preferably equal to or less than 150 yards. In respect of capturing the last half trajectory d1 in a wide range, the distance between the radar R2 and the landing point p2 is preferably equal to or greater than 100 yards.

The measurement accuracy of the falling condition can be improved as compared with the measurement in only the radar R1 by setting the two radars R3 and R2 set at different positions near the landing point p2.

In the embodiment, the initial condition and the falling condition are measured. A run Dr is also calculated based on the initial condition and the falling condition. The run Dr is a distance between the landing point p2 and a final arriving point p3.

For a measurement time of the initial condition, an elapsed time from an impact is preferably 0.00 second or greater and 0.01 second or less. Examples of the initial condition include a ball velocity, a launch angle in a horizontal direction, a launch angle in a vertical direction, backspin, and side spin.

In the embodiment, the side spin (rpm) as the initial condition, that is, initial side spin is used for simulation of the run Dr. In the embodiment, the initial condition other than the side spin is not used. For example, in the embodiment, the backspin is not used for the simulation of the run Dr. It was found that the accuracy of the simulation of the run Dr is increased by using the side spin as the initial condition. It was found that the accuracy of the simulation of the run Dr is increased by using only the initial side spin as the initial condition. It was found that the use of the initial side spin is more effective than the use of the initial backspin.

The initial condition can also be measured by the radar. However, in respect of the measurement accuracy, the initial condition is preferably measured using a measuring apparatus provided near a ball hitting point p1. The initial condition is measured by a camera, a flash, and a laser or the like in the typical measuring apparatus. Spin such as the side spin can be measured by photographing a ball on which a mark is placed by a camera. A measuring apparatus and a measuring method for the initial condition are known.

Figure 5:
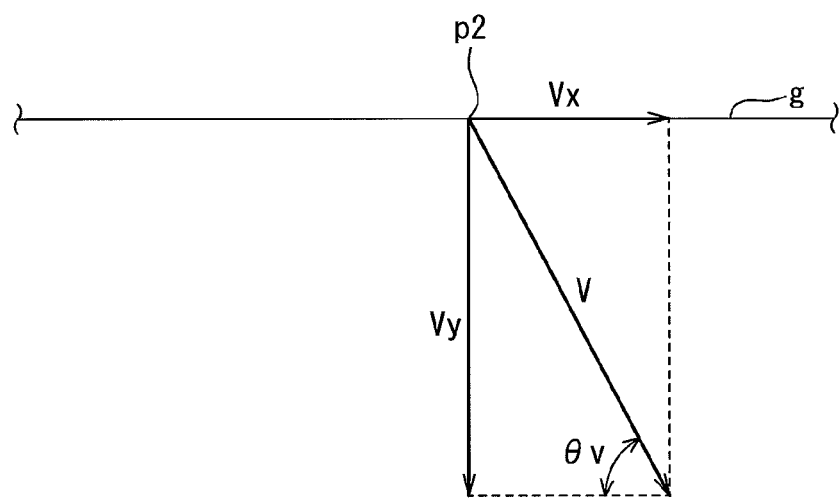
FIG. 5 describes a falling velocity.

In respect of the measurement accuracy, the measurement of the falling condition is preferably based on the radar. In respect of simulation accuracy, the falling condition is preferably close to a time T1 when the ball lands on the landing point. The measurement time of the falling condition is preferably a time earlier than the time T1 by 0.1 second to the time T1 (excluding the time T1). For a ball position when the falling condition is measured, the height above the ground is preferably equal to or less than 50 cm, In FIG. 5, a vector of a falling velocity V is shown by an arrow. The falling velocity V at the time T1 is shown in FIG. 5. In the embodiment, the falling velocity V is used for the simulation of the run Dr. It was found that the accuracy of the simulation of the run Dr is increased by using the falling velocity V as the falling condition.

The falling velocity V is measured by the radar. The trajectory is also measured by the radar. The position and velocity of the ball can be obtained in time series by the radar.

As shown in FIG. 5, the falling velocity V can be decomposed into a target direction component Vx and a vertical direction component Vy. It was found that the accuracy of the simulation of the run Dr is increased by using these components Vx and Vy. In the application, the target direction is set to an X direction, and the vertical direction is set to a Y direction.

It was found that a calculation formula of the run Dr is preferably a quadratic function having the initial condition and the falling condition as variables as a result of the test.

When the run is defined as Dr (yard); a target direction component of the falling velocity is defined as Vx (m/s); a vertical direction component of the falling velocity is defined as Vy (m/s); and the initial side spin is defined as S (rpm), a calculation formula of the run Dr is preferably the following formula (1)

$$Dr = C_1 \times Vx^2 - C_2 \times Vx + C_3 \times Vy^2 + C_4 \times Vy - C_5 \times S + C_6 \quad (1)$$

$C_1$, $C_2$, $C_3$, $C_4$, $C_5$, and $C_6$ are positive constants. The run Dr is a distance along a target direction. The target direction is a direction of a straight line connecting the ball hitting point p1 with the target direction.

In respect of the measurement accuracy, the constant $C_1$ is preferably 0.09 or greater and 0.10 or less, more preferably 0.096 or greater and 0.097 or less, and still more preferably 0.0964.

In respect of the measurement accuracy, the constant $C_2$ is preferably 2 or greater and 3 or less, more preferably 2.5 or greater and 3.0 or less, still more preferably 2.8 or greater and 2.9 or less, and yet still more preferably 2.84.

In respect of the measurement accuracy, the constant $C_3$ is preferably 0.1 or greater and 0.2 or less, more preferably 0.1 or greater and 0.15 or less, still more preferably 0.13 or greater and 0.14 or less, and yet still more preferably 0.133.

In respect of the measurement accuracy, the constant $C_4$ is preferably 5 or greater and 6 or less, more preferably 5.5 or greater and 6.0 or less, still more preferably 5.6 or greater and 5.7 or less, and yet still more preferably 5.65.

In respect of the measurement accuracy, the constant $C_5$ is preferably 0.0005 or greater and 0.001 or less, more preferably 0.0009 or greater and 0.001 or less, and still more preferably 0.00099.

In respect of the measurement accuracy, the constant $C_6$ is preferably 80 or greater and 90 or less, more preferably 80 or greater and 85 or less, still more preferably 81 or greater and 82 or less, and yet still more preferably 81.9.

In the embodiment, the run is simulated by using the initial condition and the falling condition. Conventionally, a technical thought using both the initial condition and the falling condition did not exist. When the falling condition can be measured, a person skilled in the art should consider that it is no longer necessary to take account of the initial condition. This is because the falling condition shows a final state of the flying ball, and shows a state of the ball just before the run is generated. However, it was found that the run can be more correctly simulated by adding the initial condition to the actually measured falling condition.

EXAMPLES

Hereinafter, the effects of the present invention will be clarified by examples. However, the present invention should not be interpreted in a limited way based on the description of the examples.

Example 1

Many shots were performed using a driver (1-wood), a 3-wood, and a 5-iron, to obtain actually measured values of runs and to measure falling velocities V, backspin rates, and side spin rates. A simulation apparatus shown in FIG. 1 was used for the measurement. Three radars are disposed as shown in FIG. 4, to measure trajectories and the falling velocities V. "TrackMan" (trade name) manufactured by ISG A/S Denmark was used as the radar. Head speeds, initial backspins, and initial side spins were measured by a well-known method.

A falling velocity Vx, a falling velocity Vy, and a falling angle θv were obtained based on the measured falling velocity V (vector). The run is a distance in a target direction (X direction). The falling velocity V was set to a velocity when a height of a ball from a ground g was 0.1 m. Data actually measured under a condition where the weather was clear and the wind was almost still were employed. The number of the employed data in the driver was 552; that in the 3-wood, 83; and that in the 5-iron, 232. In the 552 data in the driver, the average value of the head speeds was 42.1 m/s; the maximum value thereof, 49.8 m/s; and the minimum value thereof, 35.2 m/s. In the 83 data of the 3-wood, the average value of the head speeds was 43.8 m/s; the maximum value thereof, 46.3 m/s; and the minimum value thereof, 41.4 m/s. In the 232 data in the 5-iron, the average value of the head speeds was 36.3 m/s; the minimum value thereof, 41.4 m/s; and the minimum value thereof, 30.6 m/s. The availability of the present invention was confirmed by increasing the number of the data. The maximum value, minimum value, and average value of the measured values are shown in the following Table 1. The backspin is the initial backspin and the side spin is the initial side spin. In the side spin, a minus value means side spin making trajectory curved in a right direction, and a plus value means side spin making trajectory curved in a left direction.

TABLE 1

| | | | | | | |
|---|---|---|---|---|---|---|
| | Data employed for multiple regression analysis | | | | | |
| | Number of data | Head speed [m/s] | Backspin [rpm] | Side spin [rpm] | Falling velocity Vx [m/s] | Falling velocity Vy [m/s] |
| W#1 (Driver) | 552 | Average 42.1 | Average 2493 | Average −267 | Average 23.9 | Average −16.2 |
| | | Maximum 49.8 | Maximum 4444 | Maximum 1118 | Maximum 35.0 | Maximum −9.3 |

TABLE 1-continued

Data employed for multiple regression analysis

| | Number of data | Head speed [m/s] | Backspin [rpm] | Side spin [rpm] | Falling velocity Vx [m/s] | Falling velocity Vy [m/s] |
|---|---|---|---|---|---|---|
| FW3 (3-wood) | 83 | Minimum 35.2 Average 43.8 Maximum 46.3 | Minimum 786 Average 3099 Maximum 4497 | Minimum −2203 Average −616 Maximum 1380 | Minimum 14.7 Average 18.9 Maximum 27.9 | Minimum −23.2 Average −15.3 Maximum −7.1 |
| I#5 (5-iron) | 232 | Minimum 41.4 Average 36.3 Maximum 41.4 Minimum 30.6 | Minimum 1191 Average 5210 Maximum 6837 Minimum 3179 | Minimum −2075 Average −122 Maximum 2282 Minimum −1840 | Minimum 11.8 Average 15.1 Maximum 21.1 Minimum 10.0 | Minimum −21.2 Average −17.7 Maximum −12.9 Minimum −21.7 |

Regression analysis was performed using these data. Multiple regression analysis was employed as a technique of the regression analysis. "STATISTICA" (trade name) manufactured by Statsoft Inc. was used as software used in the multiple regression analysis.

In example 1, an objective variable and a dependent variable were as follows.

[Objective Variable]: Run Dr (yard)
[Dependent Variable]: Falling velocity Vx (m/s), Falling velocity Vy (m/s), Vx$^2$, Vy$^2$, Initial Side Spin S (rpm)

Figure 6:
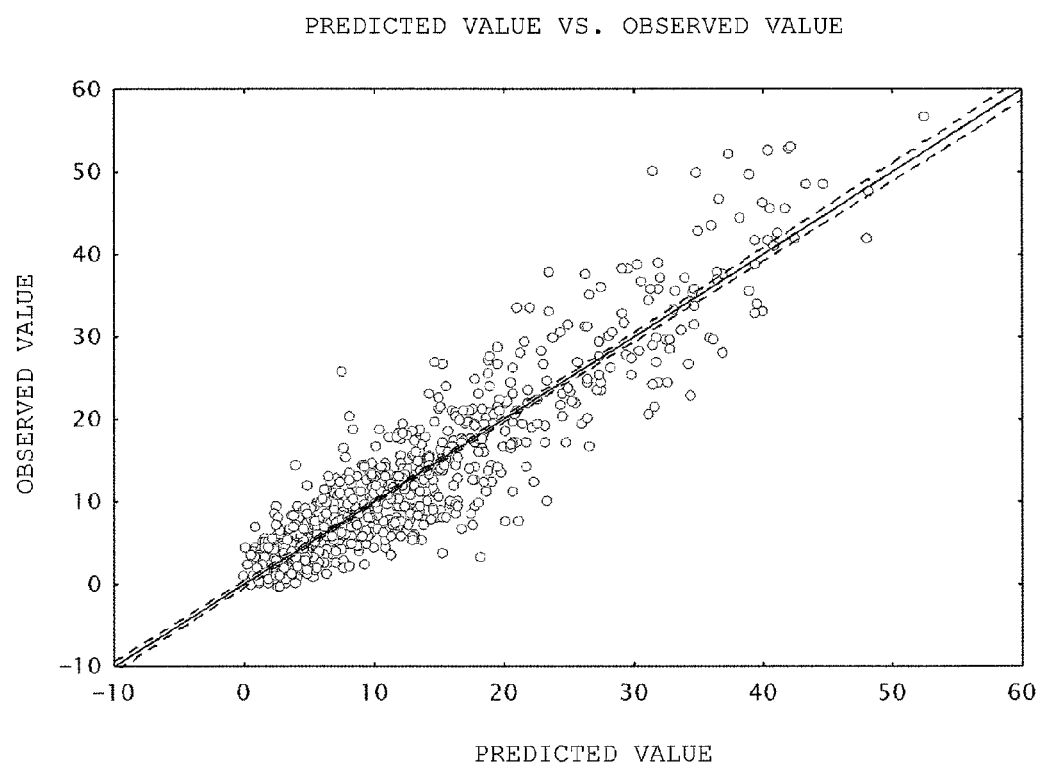
FIG. 6 is a graph showing a result of multiple regression analysis of example 1.

FIG. 6 is a graph showing an analysis result of the example 1. In FIG. 6, a horizontal axis shows a predicted value (yard) of the run, and a vertical axis shows an observed value (yard) of the run. That is, the vertical axis shows the actually measured value. A straight line shown by a solid line in FIG. 6 shows a regression line, and two dashed lines show a 95% confidence interval. The obtained simulation formula was as follows.

$$Dr = C_1 \times Vx^2 - C_2 \times Vx + C_3 \times Vy^2 + C_4 \times Vy - C_5 \times S + C_6$$

The constant $C_1$ was 0.0964; the constant $C_2$ was 2.84; the constant $C_3$ was 0.133; the constant $C_4$ was 5.65; the constant $C_5$ was 0.00099; and the constant $C_6$ was 81.9. A multiple correlation coefficient R between the run Dr obtained according to the mathematical formula and the observed value of the run was 0.925, and a determination coefficient $R^2$ was 0.856.

Comparative Example 1

Multiple regression analysis was performed in the same manner as in the example 1 except that the objective variable and the dependent variable were as follows.

[Objective Variable]: Run Dr (yard)
[Dependent Variable]: Falling Angle θv (degree), Falling velocity V (m/s)

Figure 7:
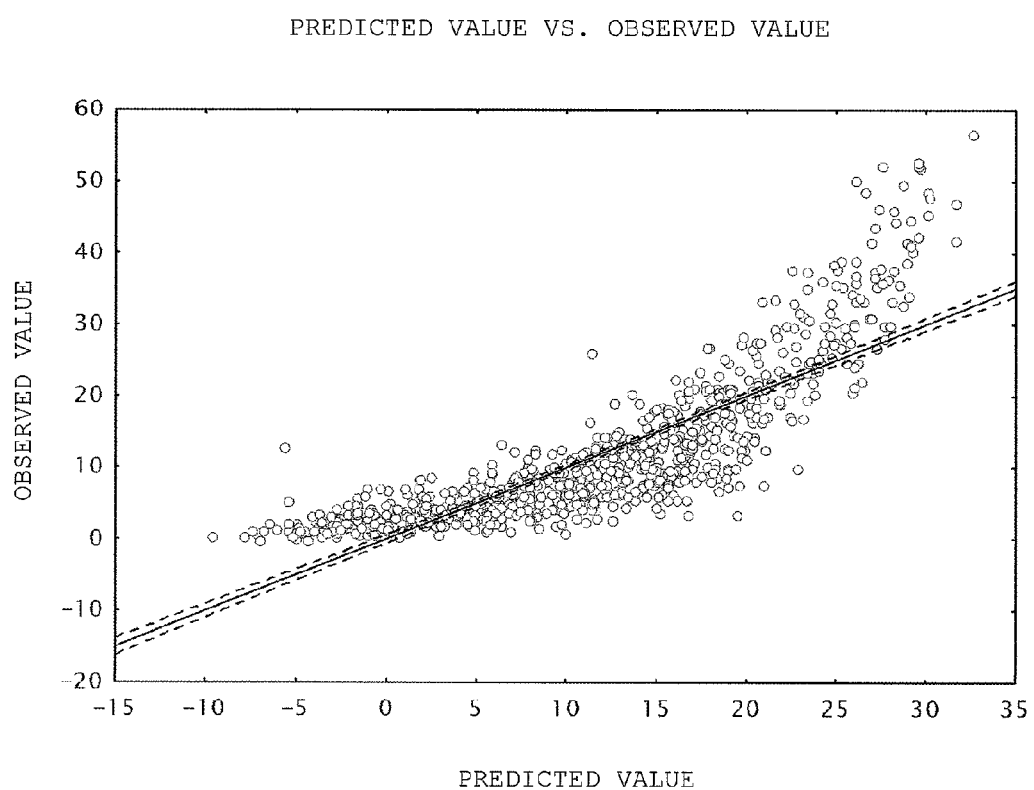
FIG. 7 is a graph showing a result of multiple regression analysis of comparative example 1.

FIG. 7 is a graph showing an analysis result of comparative example 1. In FIG. 7, a horizontal axis shows a predicted value (yard) of the run, and a vertical axis shows an observed value (yard) of the run. A straight line shown by a solid line in FIG. 7 shows a regression line, and two dashed lines show a 95% confidence interval. The obtained simulation formula was as follows.

$$Dr = 0.610 \times V + 0.754 \times \theta v + 24.2$$

A multiple correlation coefficient R between the run Dr obtained according to the mathematical formula and the observed value of the run was 0.846, and a determination coefficient $R^2$ was 0.716.

Comparative Example 2

Multiple regression analysis was performed in the same manner as in the example 1 except that the objective variable and the dependent variable were as follows.

[Objective Variable]: Run Dr (yard)
[Dependent Variable]: Falling velocity Vx (m/s), Falling velocity Vy (m/s)

Figure 8:
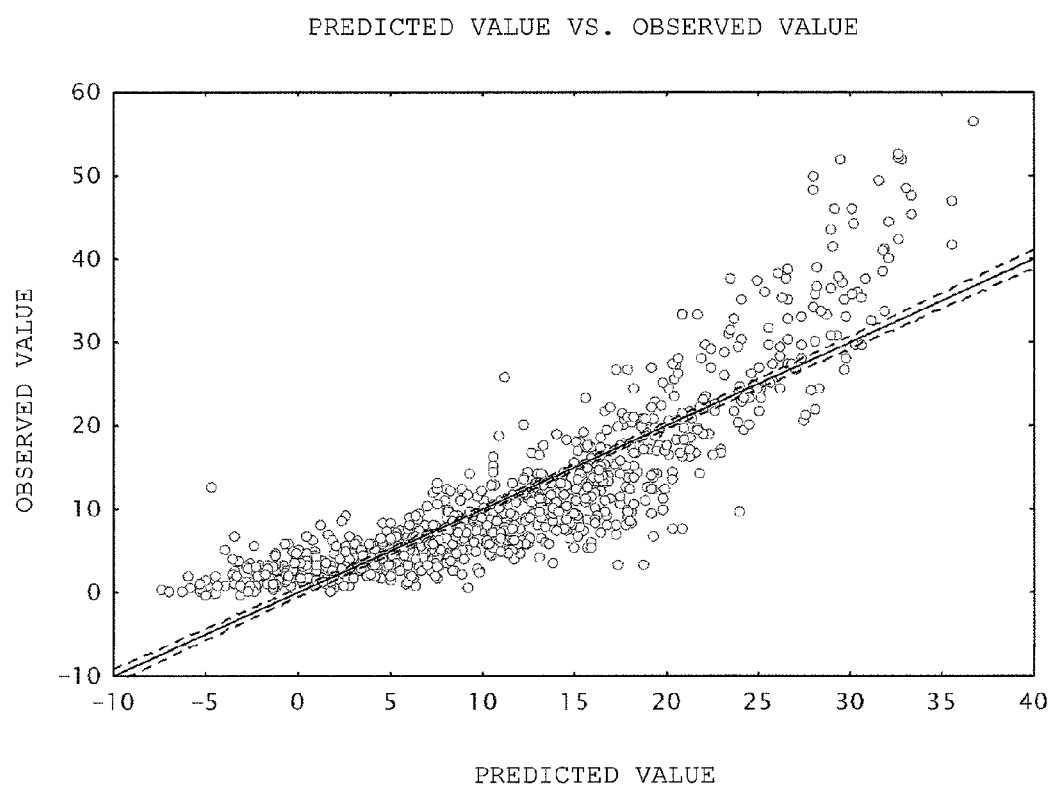
FIG. 8 is a graph showing a result of multiple regression analysis of comparative example 2.

FIG. 8 is a graph showing an analysis result of comparative example 2. In FIG. 8, a horizontal axis shows a predicted value (yard) of the run, and a vertical axis shows an observed value (yard) of the run. A straight line shown by a solid line in FIG. 8 shows a regression line, and two dashed lines show a 95% confidence interval. The obtained simulation formula was as follows.

$$Dr = 1.35 \times Vx + 1.42 \times Vy + 6.52$$

A multiple correlation coefficient R between the run Dr obtained according to the mathematical formula and the observed value of the run was 0.876, and a determination coefficient $R^2$ was 0.767.

Example 2

Multiple regression analysis was performed in the same manner as in the example 1 except that the objective variable and the dependent variable were as follows.

[Objective Variable]: Run Dr (yard)
[Dependent Variable]: Falling velocity Vx (m/s), Falling velocity Vy (m/s), Initial Backspin B (rpm)

Figure 9:
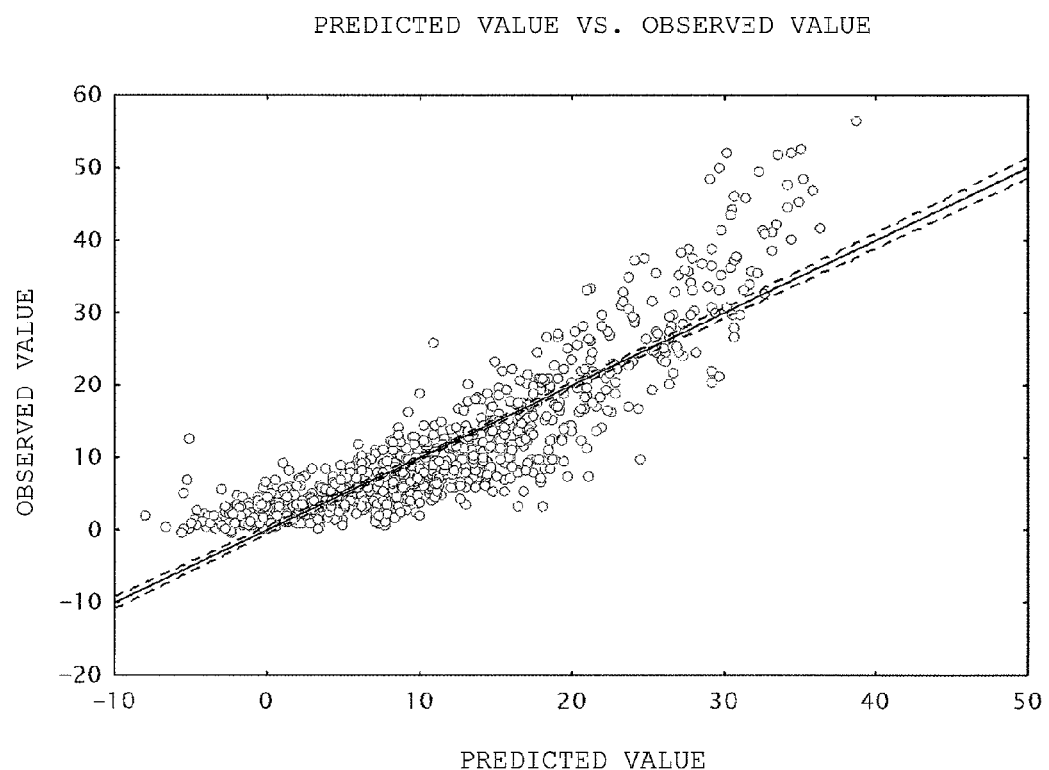
FIG. 9 is a graph showing a result of multiple regression analysis of example 2.

FIG. 9 is a graph showing an analysis result of example 2. In FIG. 9, a horizontal axis shows a predicted value (yard) of the run, and a vertical axis shows an observed value (yard) of the run. A straight line shown by a solid line in FIG. 9 shows a regression line, and two dashed lines show a 95% confidence interval. The obtained simulation formula was as follows.

$$Dr = 0.00148 \times B + 1.64 \times Vx + 1.50 \times Vy - 3.38$$

A multiple correlation coefficient R between the run Dr obtained according to the mathematical formula and the observed value of the run was 0.883, and a determination coefficient $R^2$ was 0.779.

Example 3

Multiple regression analysis was performed in the same manner as in the example 1 except that the objective variable and the dependent variable were as follows.

[Objective Variable]: Run Dr (yard)
[Dependent Variable]: Falling velocity Vx (m/s), Falling velocity Vy (m/s), Initial Side Spin S (rpm)

Figure 10:
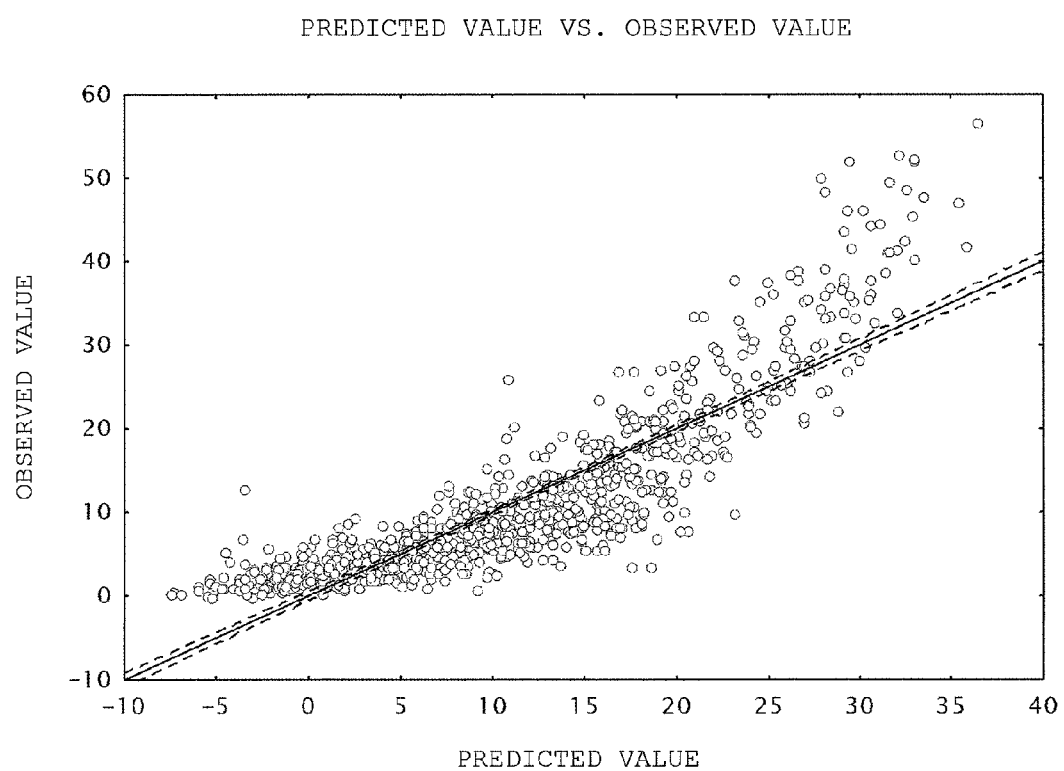
FIG. 10 is a graph showing a result of multiple regression analysis of example 3.

FIG. 10 is a graph showing an analysis result of example 3. In FIG. 10, a horizontal axis shows a predicted value (yard) of the run, and a vertical axis shows an observed value (yard) of the run. A straight line shown by a solid line in FIG. 10 shows a regression line, and two dashed lines show a 95% confidence interval. The obtained simulation formula was as follows.

$$Dr=-0.000693 \times S+1.34 \times Vx+1.40 \times Vy+6.08$$

A multiple correlation coefficient R between the run Dr obtained according to the mathematical formula and the observed value of the run was 0.876, and a determination coefficient $R^2$ was 0.768.

Example 4

Multiple regression analysis was performed in the same manner as in the example 1 except that the objective variable and the dependent variable were as follows.

[Objective Variable]: Run Dr (yard)
[Dependent Variable]: Falling velocity Vx (m/s), Falling velocity Vy (m/s), Initial Backspin B (rpm), Initial Side Spin S (rpm)

Figure 11:
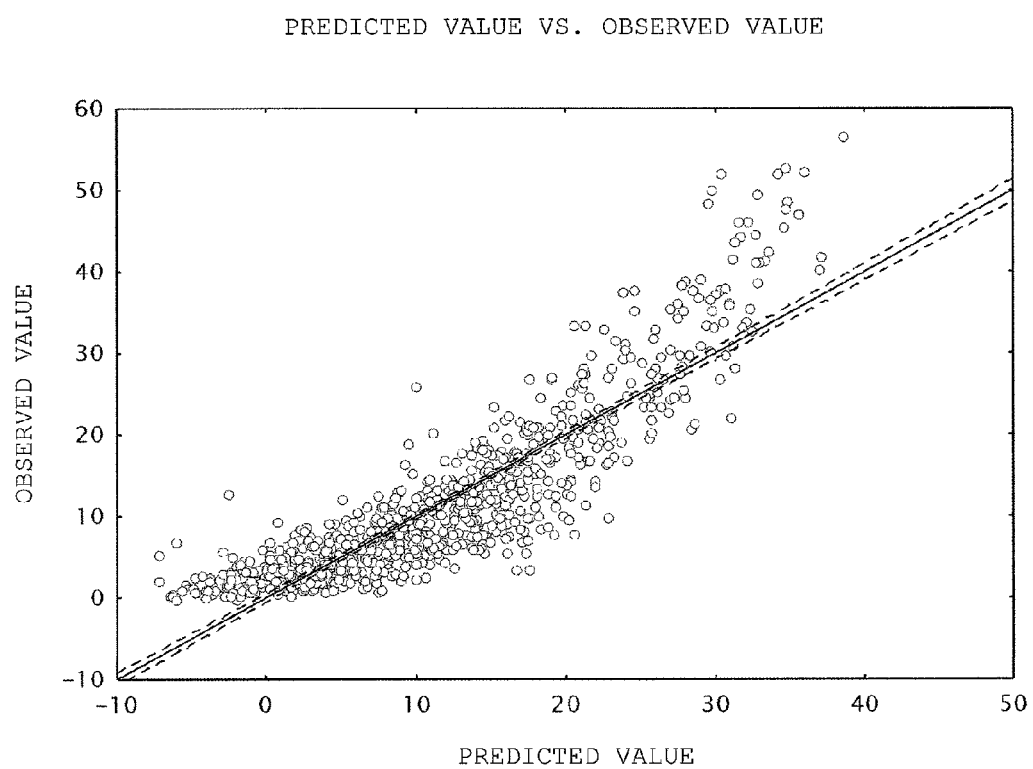
FIG. 11 is a graph showing a result of multiple regression analysis of example 4.

FIG. 11 is a graph showing an analysis result of example 4. In FIG. 11, a horizontal axis shows a predicted value (yard) of the run, and a vertical axis shows an observed value (yard) of the run. A straight line shown by a solid line in FIG. 11 shows a regression line, and two dashed lines show a 95% confidence interval. The obtained simulation formula was as follows.

$$Dr=0.00184 \times B-0.00157 \times S+1.70 \times Vx+1.46 \times Vy-6.79$$

A multiple correlation coefficient R between the run Dr obtained according to the mathematical formula and the observed value of the run was 0.886, and a determination coefficient $R^2$ was 0.785.

As described above, the examples are highly evaluated as compared with the comparative examples. The advantages of the present invention are apparent from the evaluation result.

The method described above can be applied to the simulation of the run.

The description hereinabove is merely for an illustrative example, and various modifications can be made in the scope not to depart from the principles of the present invention.

What is claimed is:

1. A method comprising the steps of:
measuring an initial condition and a falling condition of a hit ball by using a measuring device, the hit ball being a golf ball hit by a golf club;
simulating, by a processor, a run which is a distance between a landing point and a final arriving point using the measured initial condition of the hit ball and the actually measured falling condition; and
generating information of the run of the hit ball for developing the golf ball or the golf club according to results of the step of simulating,
wherein the falling condition is a falling velocity, and the initial condition is only the initial side spin, and
wherein when the run is defined as Dr (yard); a target direction component of the falling velocity is defined as Vx (m/s); a vertical direction component of the falling velocity is defined as Vy (m/s); and initial side spin is defined as S (rpm), the run is calculated according to the following formula:

$$Dr=C_1 \times Vx^2-C_2 \times Vx+C_3 \times Vy^2+C_4 \times Vy-C_5 \times S+C_6,$$

wherein $C_1$ is no less than 0.09 but no more than 0.10, $C_2$ is no less than 2 but no more than 3, $C_3$ is no less than 0.1 but no more than 0.2, $C_4$ is no less than 5 but no more than 6, $C_5$ is no less than 0.0005 but no more than 0.001, and $C_6$ is no less than 80 but no more than 90.

* * * * *